United States Patent
Huang et al.

[11] Patent Number: 6,060,992
[45] Date of Patent: May 9, 2000

[54] METHOD AND APPARATUS FOR TRACKING MOBILE WORK-IN-PROCESS PARTS

[75] Inventors: Cheng Yi Huang; Kuo Hung Liao, both of Hsin-Chu, Taiwan

[73] Assignee: Taiwan Semiconductor Manufacturing Co., Ltd., Hsin-Chu, Taiwan

[21] Appl. No.: 09/143,160

[22] Filed: Aug. 28, 1998

[51] Int. Cl.[7] .................................................. G08B 21/00
[52] U.S. Cl. ...................... 340/674; 340/572.1; 414/266; 414/282; 414/284; 414/279
[58] Field of Search ................................. 340/674, 572.1, 340/572.2, 572.3, 572.4, 572.8, 568.1, 571, 825.35, 673; 414/935, 940, 919, 802, 809, 814, 284, 286, 282, 266, 279

[56] References Cited

U.S. PATENT DOCUMENTS

| | | | |
|---|---|---|---|
| 4,773,807 | 9/1988 | Kroll et al. | 414/282 |
| 5,233,844 | 8/1993 | Knippscheer et al. | 62/440 |
| 5,565,846 | 10/1996 | Geiszler et al. | 340/572 |
| 5,570,990 | 11/1996 | Bonora et al. | 414/543 |
| 5,607,187 | 3/1997 | Salive et al. | 283/67 |
| 5,725,253 | 3/1998 | Salive et al. | 283/67 |
| 5,869,820 | 2/1999 | Chen et al. | 235/376 |
| 5,885,045 | 3/1999 | Rush | 414/417 |
| 5,886,634 | 3/1999 | Muhme | 340/572 |

*Primary Examiner*—Jeffery A. Hofsass
*Assistant Examiner*—Toan Pham
*Attorney, Agent, or Firm*—Tung & Associates

[57] ABSTRACT

A mobile WIP parts tracking system useful in semiconductor fabrication operations, includes an identifying tag fixed to each of a plurality of parts containers, and a tag reader mounted on the head of a robotic carrier which delivers the containers to and removes the containers from any or a plurality of storage bin containers within a storage facility. A control system coordinates the movements of the robotic carrier and received information from the tag reader in order to provide positive, continuous tracking of the storage bin location of each of the containers within the facility. In addition to generating continuous tracking information, the robotic carrier may be used to scan each of the storage bin locations in order to search for a desired container.

22 Claims, 4 Drawing Sheets

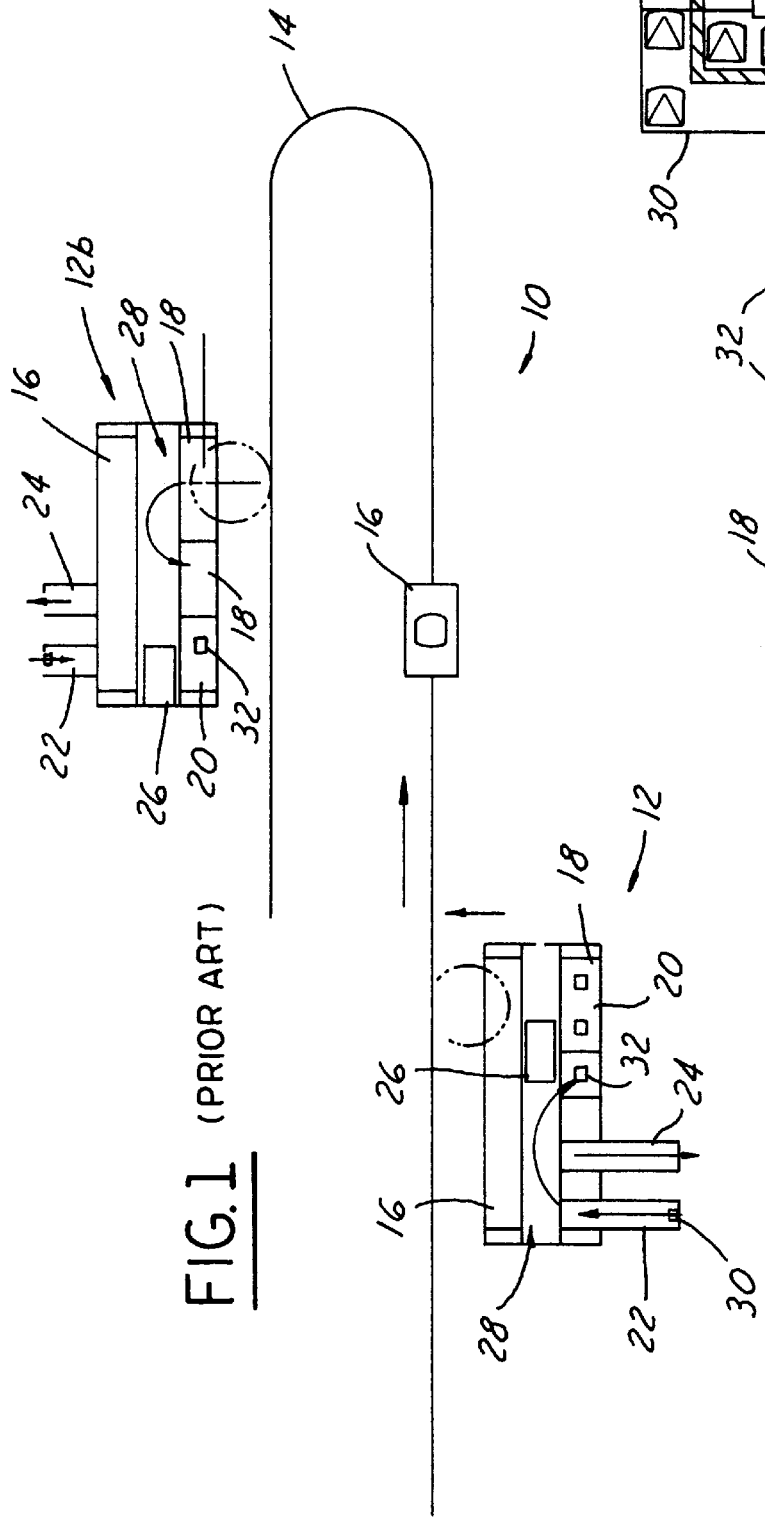
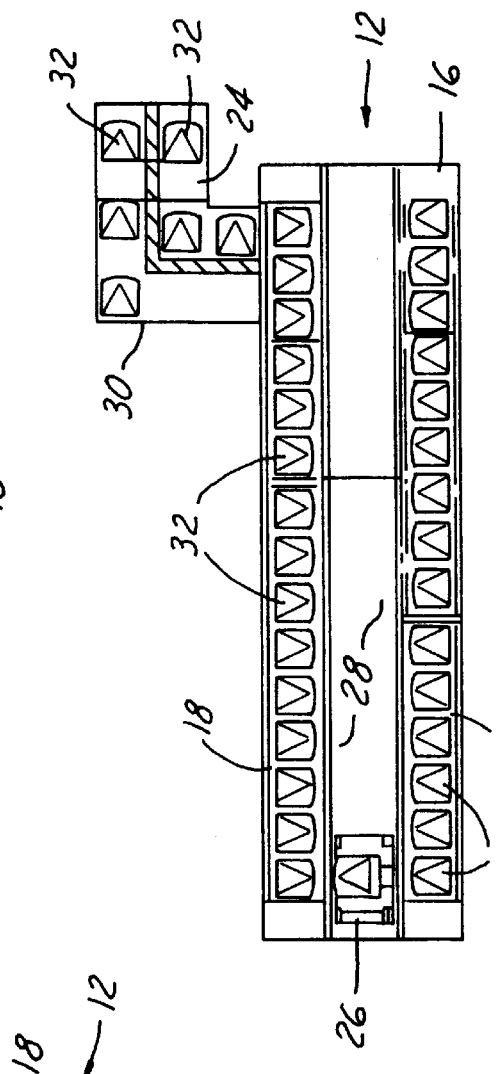

METHOD AND APPARATUS FOR TRACKING MOBILE WORK-IN-PROCESS PARTS

FIELD OF THE INVENTION

The present invention generally relates to a method and apparatus for transporting mobile work-in-process WIP parts, and deals more particularly with a mobile WIP parts tracks system providing continuous, positive identification and location tracking of all WIP parts.

BACKGROUND OF THE INVENTION

In a high volume production environment, such as a facility for fabricating semiconductor devices, the product usually requires processing at each of numerous stations or processing machines. The transporting or conveying of partially finished products, or WIP parts, is important element in achieving efficiency and quality in the overall manufacturing process. The ability to efficiently transport and track WIP parts is especially important in the manufacturing of semi-conductor devices, such as integrated circuit devices. Conveying and tracking WIP parts in a semiconductor fabrication plant is particularly challenging, since as many as several hundred fabrication steps are required to complete the fabrication of a device, and these fabrication steps are carried out at a multiplicity of processing stations under extremely clean conditions, where human handling of the devices must be minimized. To complete the fabrication of an IC circuit, for example, various steps such as deposition, cleaning, ion implantation, etching and passivation must be completed before an IC chip can be packaged for shipment. Each of these fabrication steps must be performed by a different process machine, such as a chemical vapor deposition chamber, or an ion implantation chamber, etcher, etc. A partially processed semi-conductor wafer therefore must be conveyed between various work stations many times before it is completed. To achieve the goal of minimum handling by plant personnel, the IC chips are normally conveyed between workstations in a completely automated manner.

One of the automated methods of transporting wafers between work stations or process machines involves loading wafers into a container, sometimes referred to as a "pod", and then transporting the pod on an automated vehicle which rides on tracks established between work stations. In the case of the processing of semi-conductor wafers, the wafers are normally loaded into cassettes, which are placed into the pods. The cassette is loaded into the bottom end of the pod since the top is sealed off to reduce the possibility of contamination.

In order to identify and locate the various WIP parts contained in the pod, the pods are labeled with a tag positioned on the side of the pod. The tags can be read automatically by a tag reader that is normally mounted either along guard rails paralleling the guide tracks, or along an input conveyor of a storage facility, sometimes referred to as a "stocker", which is located at each of the processing stations. At each processing station, pods are periodically removed from the stocker for processing following which they are returned to the stocker until they are later automatically removed and conveyed to the next processing station where they are held in a different stocker. Although each pod tag is read by a tag reader as it enters the stocker, for a variety of reasons, pods cannot be positively located once they are within a stocker, and thus are subject to becoming lost within the tracking system. Lost pods in the tracking system may occur for a variety of reasons, including mechanical error, communication errors, or errors by operating personnel. In any event, the inability to positively track and locate all pods at any particular point in time materially reduces processing efficiency, and thus the device throughput of the fabrication facility.

Accordingly, there is a clear need in the art for an improved WIP parts tracking system which provides continuous positive tracking of the identity and location of the parts at all times, and which is not subject to mechanical or human error.

SUMMARY OF THE INVENTION

The present invention provides a method and apparatus for tracking mobile WIP parts, particularly in the context of a semi-conductor device manufacturing facility, that is capable of positively and continuously tracking the identity and location of the parts, and which is not subject to mechanical or human error.

According to one aspect of the invention, a mobile WIP parts tracking system includes a plurality of containers to be tracked, each containing at least one part. A tag is fixed on each container which uniquely identifies that container. A transport system transports the container into and out of a storage facility where a plurality of the containers are stored for processing at a particular processing station. The transportation system includes a mobile carrier, which may comprise a robotic arm, for delivering the containers to and retrieving the containers from a plurality of storage locations, in the form of bins, within the storage facility. A tag reader is positioned on the mobile carrier within the storage facility which reads the tag on each container as the carrier deposits or retrieves the container from a particular storage location. A control system stores tag information and controls the mobile carrier. The control system is capable of operating the carrier to search and scan all of the containers within the facility in order to search out and positively identify the sought-after container.

According to another aspect of the invention a system is provided for tracking WIP parts in a semi-conductor fabrication operation which includes a plurality of pods, each containing at least one part, stored in a stocker. The stocker includes a plurality of storage bins therein, each bin being suitable for storing one of the pods. An identification tag is fixed on each pod which uniquely identifies the associated pod. An automated transport system is provided for transporting the pods into and out of the stocker, which includes a robotic carrier for delivering the pods to and retrieving the pods from the storage bins. A tag reader positioned on the robotic carrier reads the tag on each pod and generates data corresponding to the information contained on the tag. A controller receives and stores the data from the tag reader, correlates this data with the bins in order to constantly track the bin location of each pod, and controls the operation of the transport system.

According to a further aspect of the invention, a method is provided of tracking WIP parts in a semi-conductor processing operation, where the parts are carried in containers stored in a plurality of bins forming a storage facility. The method includes the steps of applying a tag to each of the containers, wherein each tag includes information uniquely identifying the corresponding container; applying a tag reader to a robotic carrier; delivering the containers to and removing them from the bins; reading the information on the tags using the tag reader; and, generating a set of data representing the bin location of each of the containers.

According to a still further aspect of the invention, a method is provided of tracking WIP semi-conductor devices in a semi-conductor device fabrication operation, where the devices are carried in pods which are stored in a plurality of bins in a stocker. The method includes the steps of: delivering the pods to and removing them from the bins using an automatic mobile carrier; automatically reading information on a tag fixed to each pod when the pod is delivered to or removed from one of the bins, the tag uniquely identifying the corresponding pod; automatically recording the position of the carrier when the carrier delivers the pod to or removes a pod from one of the bins; and, correlating the recorded position of the carrier with the information read from the tag in order to track the bin location of each of the pods.

Accordingly, it is a primary object of the present invention to provide a mobile WIP parts tracking system which provides for continuous and positive identification and location of each part within a manufacturing operation.

Another object of the invention is to provide a system as described above which eliminates lost or missing parts occurring as a result of mechanical or human error.

A further object of the present invention is to provide apparatus for continuous and positive identification of WIP parts tracking in a semi-conductor fabrication facility wherein parts are transported automatically between a plurality of processing stations.

A still further object of the invention is to provide a method and apparatus for WIP parts tracking in a semi-conductor fabrication facility which permits automatic searching of parts within the system, as well as verification of the delivery of a part to a particular destination within the system.

These, and further objects and advantages of the present invention will be made clear or will become apparent during the course of following description of a preferred embodiment of the present invention.

BRIEF DESCRIPTION OF THE DRAWINGS

In the drawings, which form an integral part of the specification and are to be read in conjunction therewith, and wherein like reference symbols are employed to designate identical components in the various views:

FIG. 1 is a diagrammatic plan view of a parts transportation system for processing semi-conductor devices, including a prior art WIP parts tracking system;

FIG. 2 is a diagrammatic plan view of one of the stockers forming a part of the transportation system of FIG. 1.

DETAILED DESCRIPTION OF THE PREFERRED EMBODIMENT

Figure 3:
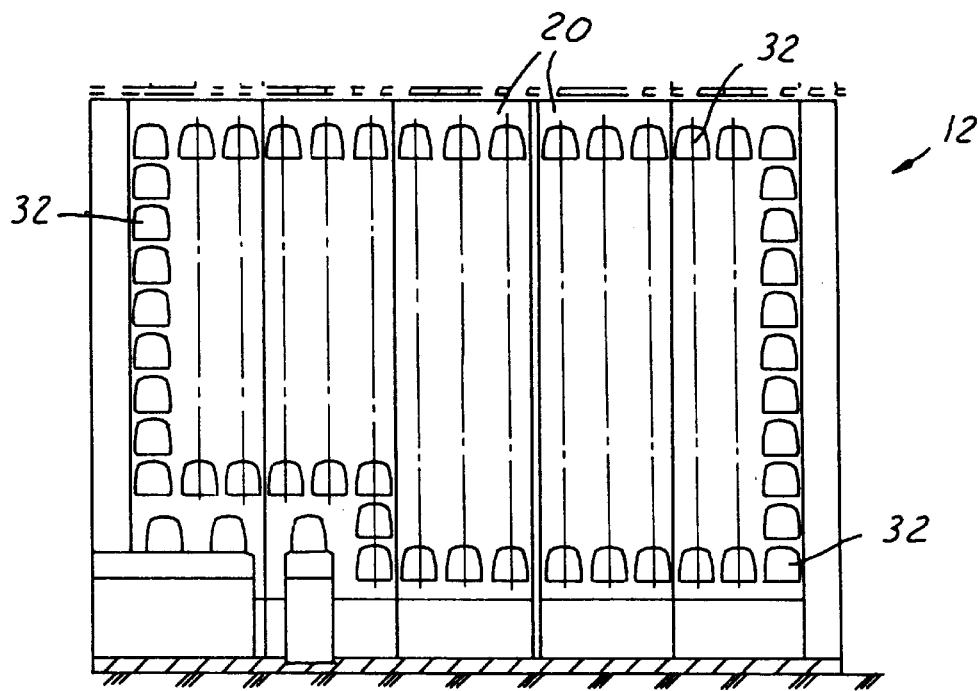
FIG. 3 is a vertical, sectional view of the stocker shown in FIG. 2.

Referring first to FIGS. 1–3, the present invention broadly relates to a mobile WIP parts tracking system for providing positive and continuous identification and location tracking of all parts in a manufacturing operation. In connection with the preferred embodiment chosen to illustrate the invention herein, a WIP parts transport system, generally indicated by the numeral 10 employed in a semi-conductor manufacturing operation, includes an automatically operated, motorized vehicle 16 traveling along a guide track 14 between a plurality of semi-conductor processing stations, each of which stations include a WIP parts storage facility in the form of stockers 12a–12b.

Each of the stockers 12 include a plurality of storage locations in the form of bins 20, each of the bins 20 being suitable for storing a container 32 for containing one or more parts. In the context of a semi-conductor wafer fabrication facility, the containers 32 are in the form of conventional pods which house a cassette of semi-conductor wafers which undergo certain fabrication processes at each of the stations, such as chemical vapor deposition, ion implantation, etching, etc.

The storage bins 20 in each of the stockers 12 are arranged in two spaced apart banks 16–18 of bins arranged in rows and columns. Access to the bins 20 is provided from a space 28 within which there is disposed a mobile pod carrier in the form of a robotic carrier 26 which will be discussed later in more detail. Operating under automatic control, the robotic carrier 26 is moveable within the space 28 to each of the bin locations and functions to either deliver a pod 32 to or remove a pod 32 from one of the bins 20.

Each of the stockers 12 includes, in a bottom portion thereof, an input port 30 and an output port 24 which respectively include an input conveyor and an output conveyor for conveying the pod 32 either into or out of the stocker for processing at the associated processing station. A conventional transfer mechanism, only generally indicated by the numeral 53, transfers the pods 32 between the stocker 12 and the transport vehicle 16.

Each of the pods 32 is provided with a later described identification tag which may comprise for example, a liquid crystal display LCD or bar code that may be scanned by a reader. The tag uniquely identifies the associated pod 32, and thus allows the parts tracking system to track each pod 32. In the past, however, a pod tag reader 30, which may comprise of for example a laser scanner or other form of optical reader, was positioned at the input port 22 of each pod, so as to read the pod tags as each pod 32 was conveyed into the stocker 12. Once a pod 32 was received into a stocker 32 however, the parts tracking control system was incapable of positively tracking the pod. In the event of a mechanical malfunction, such as where the robotic carrier 26 delivers a pod 32 to an incorrect bin 20 location, or where an error occurs in electronic communication or through operator intervention, a pod 32 becomes lost or missing within the tracking system. As a result, it is not possible to search all of the pods 32 and it thus becomes necessary for an operator to intervene by manually searching through each of the stockers 12 to find a missing pod 32.

Figure 4:
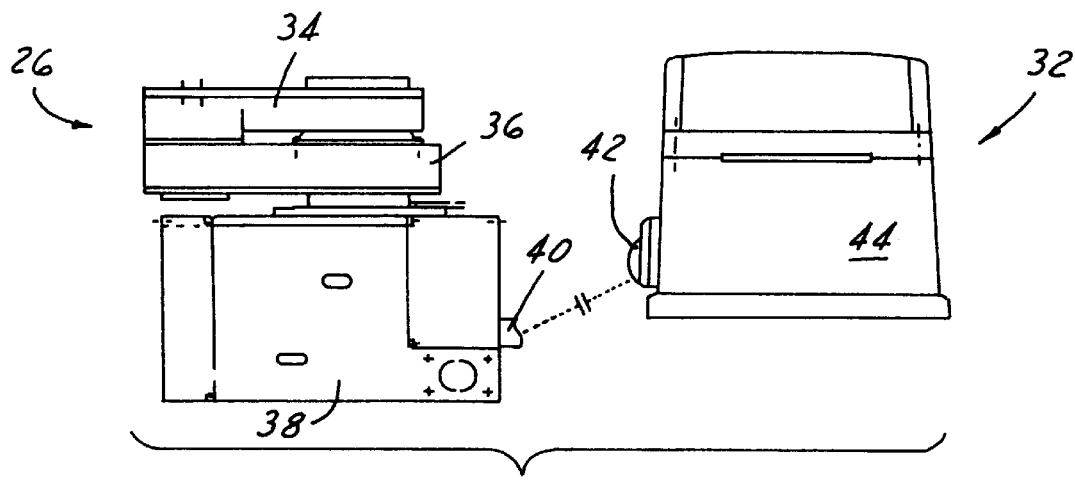
FIG. 4 is a side view showing the relationship between a robotic carrier and a pod, and depicting a tag on the pod being read by a reader on the carrier.

Referring now to FIG. 4 the present invention contemplates placing a tag reader 40 on the head 38 of the robotic carrier 26. The head 38 includes means (not shown) for grasping a pod 32 for transport. The head 38 is mounted on a pair of pivotally connected robotic arms 34, 36 controlled by suitable, conventional motor means (not shown) which move the head, and thus the pod, 32 to any of the bin locations 20. As shown in FIG. 4, the reader 40 is moved into proximity with the tag 42 which is fixed on each of the pod housings 44, whereupon the tag reader 40 extracts information from the tags 42. The reader 40 may comprise a laser scanner or other type of receiver well known in the art, capable of reading information stored on the tags 42. In the preferred form of the invention, the tag 42 comprises an LCD which displays information concerning the identity and contents of the associated pod 32, and tag reader 40 comprises an optical scanner for reading the information displayed on the LCD. The tags 42 may be read by the reader 40 either when the carrier 26 removes the pod from the input conveyor 22 for storing in a bin location 20, or when the carrier 26 removes one of the pods 32 from a bin location 20. Additionally, by moving the robotic head 38 within a stocker 12, any or all of the bins 20 may be scanned simply by moving the reader 40 past the tags 42 at each of the bin location 20, thus enabling the systems to search for certain desired pods. In this manner, pod locations are continuously tracked and can be reconfirmed by scanning all of the bin locations 20 within each of the stockers 12.

Figure 5:
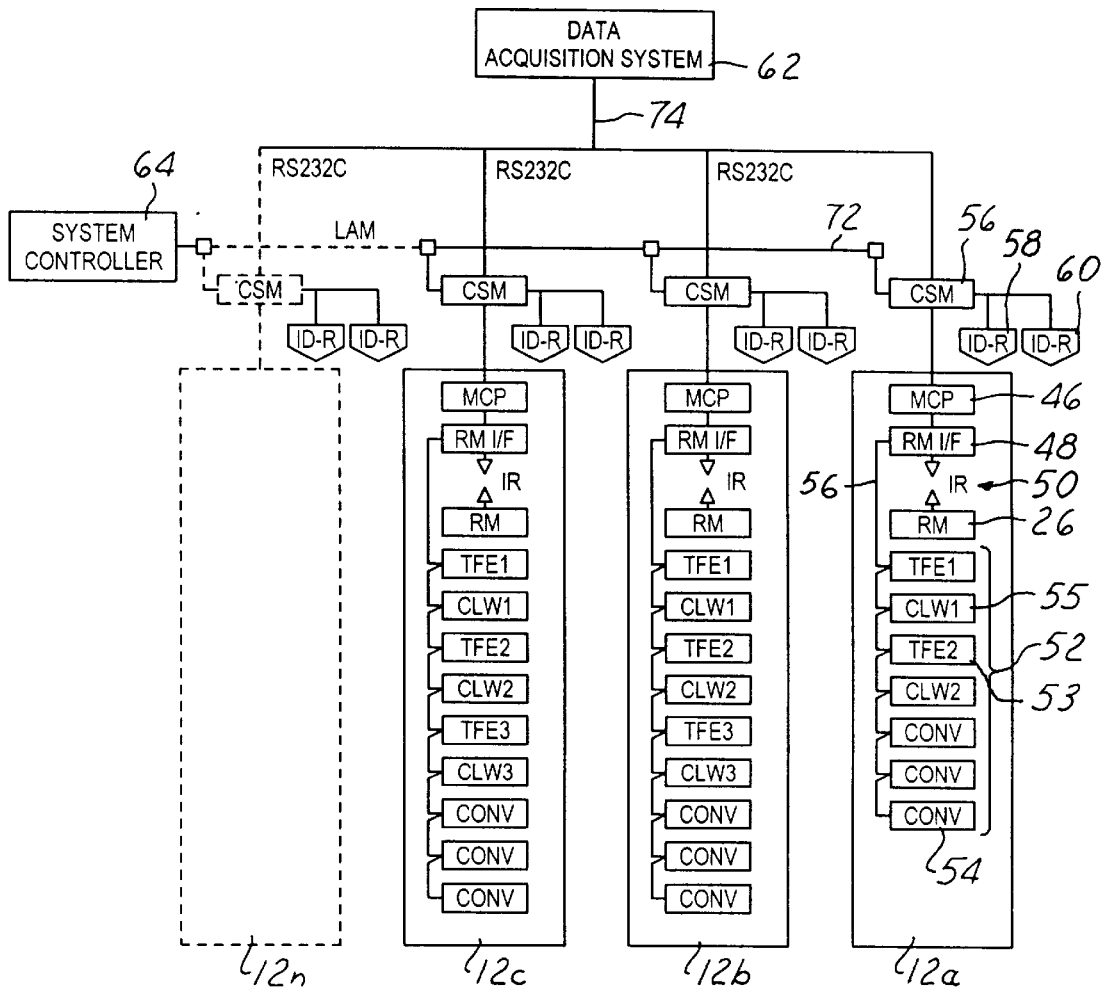
FIG. 5 is an overall block diagram of a transport system including the WIP parts tracking system of the present invention.
Figure 6:
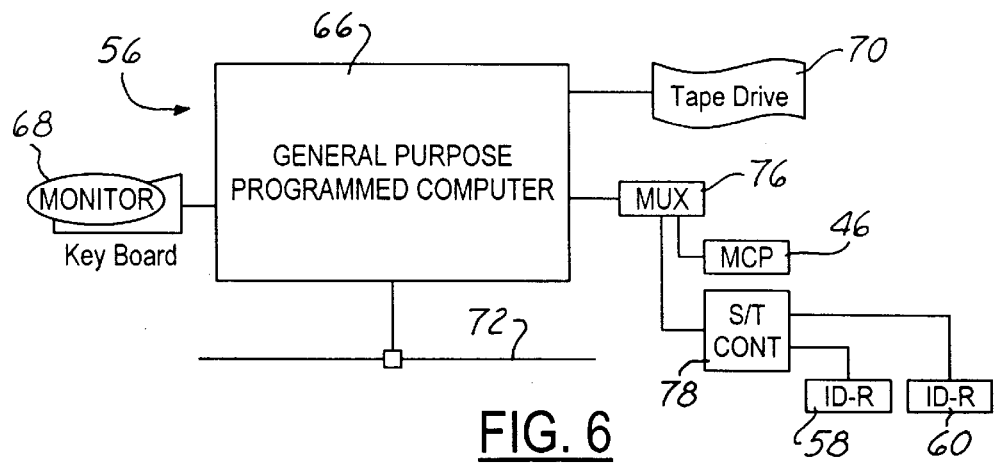
FIG. 6 is a block diagram of a stocker manager forming part of the system shown in FIG. 5.

Reference is now made to FIGS. 5 and 6. A control system is shown for controlling the operation of the tracking system, that includes the mobile carrier 26. Each of the stockers 12a, 12b, 12c, 12n, is controlled by a master control processor 46 which receives inputs from a mobile carrier rack interface 48. The interface 48 receives information on a data link 56 from a plurality of local control outputs 52 which may comprise, for example, a clean-way 55, transfer equipment 53 and conveyors 54. Further, the interface 48 transfers signals to and from the mobile carrier 26 via an infrared data link 50. In effect, the processor 46 collects information from the sensors and control elements within the associated stocker 12 and delivers control signals to the machine elements such as the transfer equipment 53 and conveyors 54 in order to control transfer and tracking of the pods 32.

External of each of the stockers 12 and associated therewith is a clean station manager 56 which controls the operations of an associated stocker 12 as well as other equipment and operations at the clean station, of which the stocker 12 forms a part. In addition to a bi-directional data link with the associated processor 46, the station manager 56 receives data from other equipment at the station via a first infrared data link 58 as well as tag information from the reader 40 via a second infrared data link 60. The station managers 56 are connected by a LAN (local area network) to a master system controller 64 which may comprise a programmable logic controller or other general purpose, programmed computer for coordinating the operations and the various processing stations. Additionally, the station managers 56 are connected by an RS232C communications link 74 to a data acquisition system 62 where information concerning station operations are stored.

As shown in FIG. 6, each of the station managers 56 broadly comprises a general purpose computer 56 which will typically include a processor and associated memory storing programmed instructions for carrying out station functions, as well as data received from machine elements and sensors within the stocker 12. The station manager 56 may also include a tape drive 70 for storing large amounts of data, as well as a key board/monitor 68. Data from the infrared links 58, 60 are processed by a storage controller 78 and delivered to one input of a multiplexer 76, a second input to the multiplexer 76 being formed by a connection with the processor 46. The multiplexer 76 multiplexes information from the processor 46 and controller 78, and the multiplexed data is delivered to the computer 66 which processes this data, stores certain information within its internal memory or on the tape drive 70 and cooperates with the data acquisition system 62 as well as the system controller 64.

Figure 7:
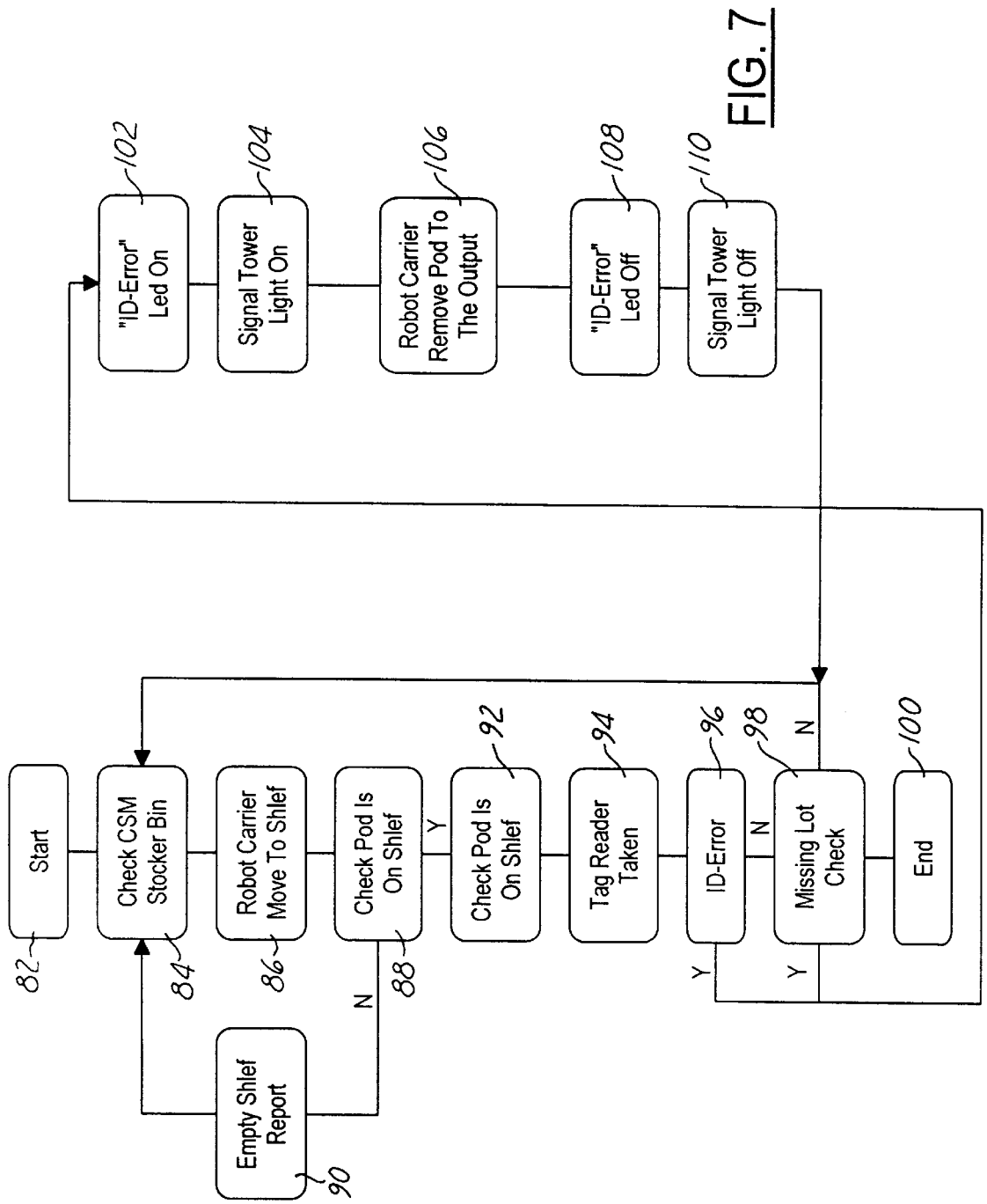
FIG. 7 is a flow chart depicting the various steps according to the inventive method of the present invention, as well as the programmed instructions used in the control system of FIG. 5.

Referring now also to FIG. 7 which depicts the basic elements of the software for implementing the tracker system of the present invention, the related method, and particularly the routine for automatically searching for one or more pods, operations are commenced at step 82, whereupon at step 84, information is gathered from the station manager 56 concerning the bin locations 20 of each of the pods 32 in a particular stocker 12. At step 86, robotic carrier 26 is moved to one of the storage bin locations 20, and the tag reader 40 reads the tag 42 of a pod 32 at that particular bin location. If no tag is detected, an empty bin report is generated at step 90. However if a tag is detected at step 92, then the tag information is read at step 94. In the event that the tag reader 40 cannot properly read the tag information at step 96, an error message is generated at step 102 which take the form of, for example, turning on an indicator light such as an LED, as well as turning on a signal tower light at the associated station, indicated at step 104. An error having been detected, as shown at step 106, the robotic carrier 26 removes the pod 32 to the output conveyor 24, following which the LED and signal tower lights are turned off at steps 108, 110, and the sequence returns to checking information at the station manager at step 84.

In a manner similar to the error generated at step 96, in the event that, after reading the tag at step 94, a pod is found to be missing which should be present at a particular bin location, an error message is generated at step 98. In the event that a tag successfully read at step 94, an error message is not generated at step 96 and a pod is not found to be missing at step 98, the automatic search process described above is repeated with respect to other bin locations until the desired pod is successfully located following which the search is terminated at 100.

From the foregoing, it is apparent that the present WIP parts tracking system not only provides for the reliable accomplishment of the objects of the invention, but does so in a particularly simple and economical manner. It is recognized, of course, that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

We claim:

1. A mobile work-in-process WIP parts tracking system, comprising:

a plurality of containers each containing at least one part;

at least one tag positioned on and respectively associated with each of said containers, each of said tags uniquely identifying the associated container;

a storage facility having a plurality of storage locations each suitable for storing one of said containers therein;

a transport system for transporting said containers into and out of said storage facility, said transport system including a mobile carrier for delivering said containers to and retrieving said containers from said storage locations;

a tag reader on said carrier for reading said tags when carrier delivers said containers to said storage locations and when said carrier retrieves said containers from said storage locations; and, control means connected with said tag reader for continuously tracking the storage location of each of said containers, and for controlling said carrier to search each of said storage locations for the presence of one of said containers therein.

2. The tracking system of claim 1, wherein said mobile carrier includes a robotic arm and a head attached to said arm, said head including means for engaging and releasably holding one of said containers, said tag reader being fixed on said head.

3. The tracking system of claim 2, wherein said tag reader includes a laser scanner for scanning said tag.

4. The tracking system of claim 2, wherein said tag includes indicia thereon, said indicia identifying the associated container.

5. The tracking system of claim 4, wherein said tag includes a liquid crystal display for visually displaying said indicia.

6. The tracking system of claim 1, wherein said control means includes means for storing data related to the location of each of said containers in said storage facility, and for controlling the operation of said mobile carrier in accordance with a set of programmed instructions.

7. The tracking system of claim 6, wherein said control means includes a data processor in said storage facility, and a computer external of said storage facility and operably coupled with said data processor.

8. The tracking system of claim 1 wherein said stage locations include two opposing sets of storage bins arranged in rows and columns.

9. The tracking system of claim 8, wherein said mobile carrier includes a pivotable head having said tag reader fixed thereon.

10. The tracking system of claim 8, wherein said mobile carrier includes a pivotable head having said tag reader fixed thereon.

11. A system for tracking work-in-process parts in a semiconductor processing operation, comprising:
    a plurality of pods each containing at least one part;
    at least one tag positioned on and respectively associated with each of said pods, each of said tags uniquely identifying the associated pod;
    at least one stocker having a plurality of storage bins therein, each of said bins being suitable for storing one of said pods therein;
    an automated transport system for transporting said pods into and out of said stocker, said transport system including a robotic carrier for delivering said pods to and retrieving said pods from said storage bins;
    a tag reader on said robotic carrier for reading said tags and for generating data corresponding to the information contained on said tag, said tag reader being operable to read each of said tags when said carrier is delivering said pods to said stockers and for reading said tags when said carrier retrieves said pods from said stockers; and,
    a controller for receiving and storing data from tag reader, for controlling the operation of said transport system and for correlating said data with said bins whereby the bin locations of all of said pods are constantly tracked.

12. The tracking system of claim 11, wherein said robotic carrier includes a robotic arm and a head attached to said arm, said head including means for engaging and releasably holding one of said containers, said tag reader being fixed on said head.

13. The tracking system of claim 11, wherein said tag reader includes a laser scanner for scanning said tag.

14. The tracking system of claim 11, wherein said tag includes indicia thereon, said indicia identifying the associated pod.

15. The tracking system of claim 14, wherein said tag includes a liquid crystal display for visually displaying said indicia.

16. The tracking system of claim 11, wherein said controller includes a computer provided with a set of programmed instructions, and memory means for storing said data and for storing information related to the position of said robotic carrier.

17. The tracking system of claim 11 wherein said stocker includes two opposing sets of said storage bins arranged in rows and columns.

18. A method of tracking work-in-process parts in a semiconductor processing operation, wherein the parts are carried in containers stored in a plurality of bins forming a storage facility, comprising the steps of:
    (A) applying a tag to each of said containers, each of said tags including information uniquely identifying the corresponding container;
    (B) applying a tag reader to a robotic carrier;
    (C) delivering said containers to and removing said containers from said bins;
    (D) reading the information on said tags using said tag reader, said information being read when said carrier delivers said containers to said bins and when said carrier removes said containers from said bins; and
    (E) generating a set of data representing the current bin location of each of said containers, using the information read in step (D).

19. The method of claim 18, including the step of (F) generating a set of data representing the movements of said robotic carrier, and wherein step (E) is performed by correlating the information read in step (D) with the data generated in step (F).

20. A method of tracking work-in-process semiconductor devices in a semiconductor device fabrication operation, wherein the devices are carried in pods stored in a plurality of bins in a stocker, comprising the steps of:
    (A) delivering said pods to and removing said pods from said bins using an automated mobile carrier;
    (B) automatically reading information on a tag fixed to each pod when the pod is delivered to or removed from one of said bins, said tag uniquely identifying the corresponding pod;
    (C) automatically recording the position of said carrier when the carrier delivers a pod to or removes a pod from one of said bins; and,
    (D) repeatedly correlating the position recorded in step (C) with the information read in step (B), whereby to continuously track the bin location of each of said pods.

21. The method of claim 20, including the steps of fixing one of said tags on each of said pods, and mounting a tag reader on said mobile carrier.

22. The method of claim 20, including the step of searching each of said bins for pods by moving said carrier to each of said bins and reading the tag on the pod thereat.

* * * * *